United States Patent
Kozen et al.

(10) Patent No.: US 9,001,859 B2
(45) Date of Patent: Apr. 7, 2015

(54) RIDGE SEMICONDUCTOR LASER AND METHOD FOR MANUFACTURING A RIDGE SEMICONDUCTOR LASER

(75) Inventors: Atsuo Kozen, Yokohama (JP); Yasuyoshi Ote, Yokohama (JP); Jun-ichi Asaoka, Yokohama (JP); Kenji Hirai, Yokohama (JP); Hiroshi Yokoyama, Yokohama (JP)

(73) Assignee: NTT Electronics Corporation, Kanagawa (JP)

( * ) Notice: Subject to any disclaimer, the term of this patent is extended or adjusted under 35 U.S.C. 154(b) by 0 days.

(21) Appl. No.: 13/577,858

(22) PCT Filed: Jan. 27, 2011

(86) PCT No.: PCT/JP2011/051658
§ 371 (c)(1),
(2), (4) Date: Aug. 8, 2012

(87) PCT Pub. No.: WO2011/105162
PCT Pub. Date: Sep. 1, 2011

(65) Prior Publication Data
US 2012/0314727 A1  Dec. 13, 2012

(30) Foreign Application Priority Data
Feb. 26, 2010 (JP) .................. 2010-041889

(51) Int. Cl.
*H01S 5/00* (2006.01)
*H01S 5/12* (2006.01)
(Continued)

(52) U.S. Cl.
CPC ............... *H01S 5/1231* (2013.01); *H01S 5/22* (2013.01); *H01S 5/2086* (2013.01); *H01S 5/209* (2013.01); *H01S 2304/04* (2013.01)

(58) Field of Classification Search
USPC .......................................... 372/50.11; 438/32
See application file for complete search history.

(56) References Cited

U.S. PATENT DOCUMENTS

| 2002/0037021 A1* | 3/2002 | Ohkubo ..................... 372/46 |
| 2003/0138016 A1* | 7/2003 | Kise et al. ................ 372/46 |

(Continued)

FOREIGN PATENT DOCUMENTS

| CN | 1445892 | 10/2003 |
| JP | 09-330882 | 12/1997 |

(Continued)

OTHER PUBLICATIONS

International Preliminary Report on Patentability dated Sep. 7, 2012 with English translation for corresponding International Patent Application No. PCT/JP2011/051658.

(Continued)

*Primary Examiner* — Yuanda Zhang
(74) *Attorney, Agent, or Firm* — Ohlandt Greeley Ruggiero & Perle L.L.P.

(57) ABSTRACT

The ridge semiconductor laser is a semiconductor laser in which a carrier stopper layer made of an AlInAs compound, a clad layer made of an AlGaInAs compound, and an etching stopper layer made of an InGaAsP compound are stacked in sequence on one side of an active layer made of an AlGaInAs compound. The ridge semiconductor laser is provided with a ridge waveguide including, in a layer made of an InP compound, a diffraction grating made of an InGaAsP compound on the opposite side of the clad layer of the etching stopper layer.

2 Claims, 1 Drawing Sheet

(51) Int. Cl.
    *H01S 5/22* (2006.01)
    *H01S 5/20* (2006.01)

(56) References Cited

U.S. PATENT DOCUMENTS

| 2003/0179794 | A1* | 9/2003 | Mihashi et al. | 372/46 |
| 2004/0099859 | A1* | 5/2004 | Nakahara et al. | 257/14 |
| 2008/0069493 | A1* | 3/2008 | Shinoda et al. | 385/14 |
| 2009/0323749 | A1* | 12/2009 | Hashimoto | 372/45.01 |

FOREIGN PATENT DOCUMENTS

| JP | 2001-144381 | 5/2001 |
| JP | 2002-026453 | 1/2002 |
| JP | 2002-057405 | 2/2002 |
| JP | 2002-158398 | 5/2002 |
| JP | 2003-258376 | 9/2003 |
| JP | 2004-179274 | 6/2004 |
| JP | 2004-311556 | 11/2004 |

OTHER PUBLICATIONS

International Search Report dated Feb. 22, 2011 for corresponding International Patent Application No. PCT/JP2011/051658 with English translation.

Chinese Office Action dated Apr. 9, 2014 corresponding to Chinese Application No. 201180010867.X; 14 pages.

* cited by examiner

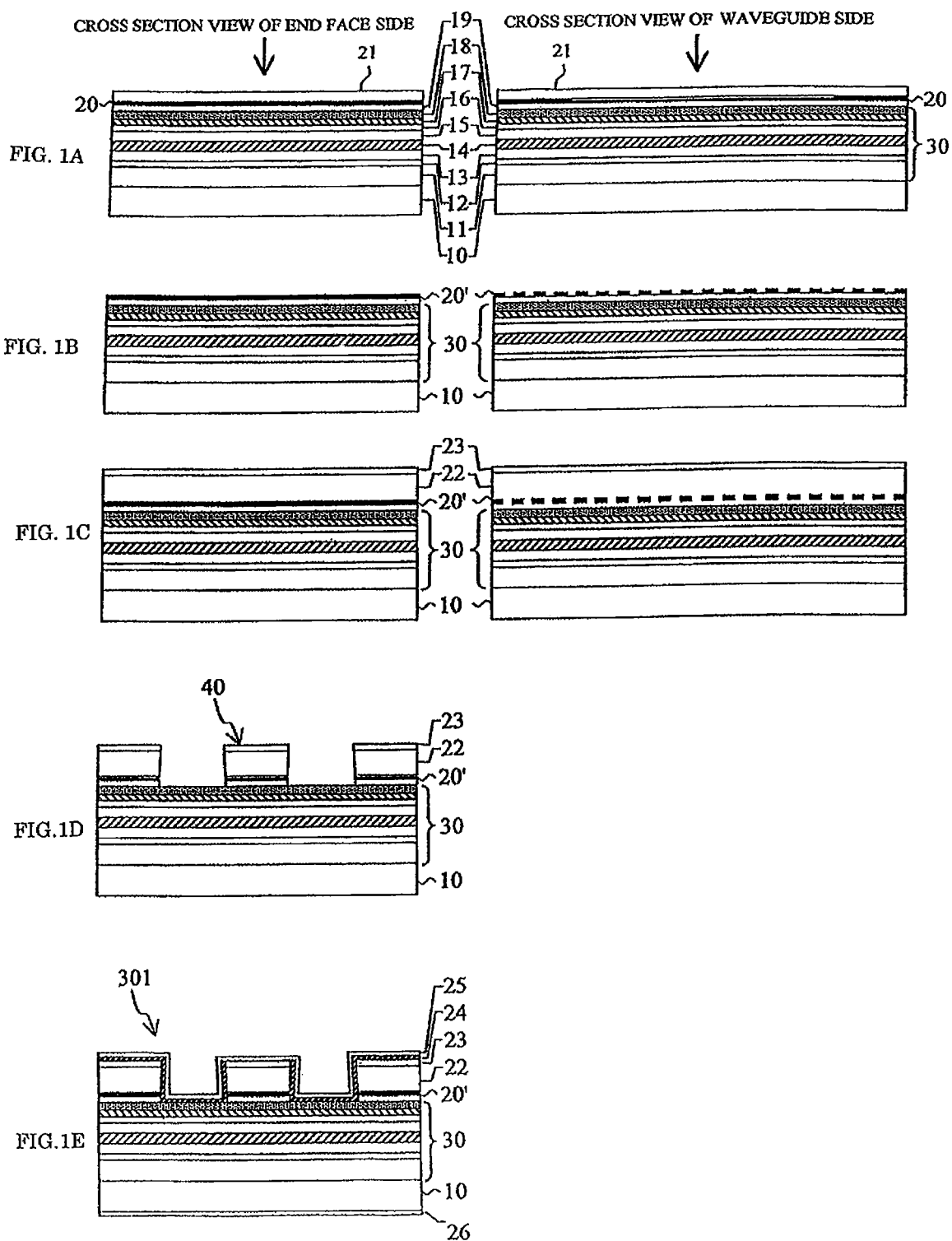

RIDGE SEMICONDUCTOR LASER AND METHOD FOR MANUFACTURING A RIDGE SEMICONDUCTOR LASER

BACKGROUND

1. Field of the Invention

The present disclosure relates to a ridge semiconductor laser in which a plurality of semiconductor layers are stacked thereon and a method for manufacturing the ridge semiconductor laser.

2. Discussion of the Background Art

There has been known to use an etching stopper layer when a ridge structure is formed by etching a layer made of an InP compound in a process of manufacturing a ridge semiconductor laser (for example, see JP 2001-144381 A). The etching stopper layer in the JP 2001-144381 A is formed of an AlGaInAs compound and it is exposed to air after formation of a ridge, so that crystal quality could be deteriorated by oxidation of Al.

Thus, an InGaAsP compound has been attempted to be used in the etching stopper layer (for example, see JP 2002-026453 A). Since this etching stopper layer does not contain Al, the deterioration of the crystal quality due to oxidation does not occur even though the etching stopper layer is exposed to air after the ridge formation. In addition, although a carrier stopper layer in the JP 2002-026453 A is an AlInAs compound, the etching stopper layer made of the InGaAsP compound covers directly above the carrier stopper layer not to be exposed in the air in the middle of a process. Consequently, the deterioration of the crystal quality of the carrier stopper layer due to the oxidation of Al does not occur.

In a distributed feedback laser (DFB laser) having an embedded diffraction grating at a ridge portion, when the embedded diffraction grating is formed by a wet etching method, it is necessary to prevent from mixing As in a ridge forming layer made of an InP compound under the diffraction grating in order to improve reproducibility of selective etching. Thus, a growth temperature of the ridge forming layer is required to be lowered. Meanwhile, in an Al-containing semiconductor layer such as an active layer made of an AlGaInAs compound, the growth temperature is required to be increased to a high temperature to enhance the crystal quality.

Thus, after the etching stopper layer between the Al-containing semiconductor layer such as an active layer and the ridge forming layer is stacked, it is necessary to lower the growth temperature and grow the ridge forming layer. Then, since the etching stopper layer contains two V-group elements (As and P), a temperature lowering process of lowering the growth temperature in an AsH$_3$ gas atmosphere and a PH$_3$ gas atmosphere is required for the purpose of protecting a growth surface of the etching stopper layer. However, the decomposition efficiencies of the two gases are different, and thus it is difficult to protect the surface of the etching stopper layer, so that there has been a problem that the crystal quality is easily deteriorated.

Thus, an object of the present disclosure is to provide a ridge semiconductor laser, which has a structure that can improve the reproducibility of the formation of a diffraction grating during manufacturing and prevent deterioration of a crystal quality of an etching stopper layer, and a method for manufacturing the ridge semiconductor laser.

SUMMARY

In order to achieve the above object, the ridge semiconductor laser according to the present disclosure is provided with a clad layer made of an AlGaInAs compound between an Al-containing semiconductor layer such as an active layer and an etching stopper layer.

Specifically, a ridge semiconductor laser according to the present disclosure includes: an AlInAs layer, an AlGaInAs layer, and a first InGaAsP layer which are stacked in sequence on one side of an AlGaInAs active layer; and a ridge waveguide which includes a first InP layer, a diffraction grating including a second InGaAsP layer, and a second InP layer on the opposite side of the AlGaInAs layer side of the InGaAsP layer.

A method for manufacturing a ridge semiconductor laser according to the present disclosure includes the steps of: stacking an AlInAs layer, an AlGaInAs layer, a first InGaAsP layer, a first InP layer, and a second InGaAsP layer in sequence on one side of an AlGaInAs active layer; and etching the second InGaAsP layer and forming a diffraction grating.

The AlGaInAs layer is provided between an Al-containing semiconductor layer such as an active layer and the first InGaAsP layer as the etching stopper layer, whereby deterioration of a crystal quality of the etching stopper layer can be prevented. Accordingly, the present disclosure can provide a ridge semiconductor laser, which has a structure that can improve the reproducibility of the formation of a diffraction grating during manufacturing and prevent the deterioration of the crystal quality of the etching stopper layer, and a method for manufacturing the ridge semiconductor laser.

In the stacking step of the method for manufacturing a ridge semiconductor laser according to the present disclosure, there is a characteristic that a temperature at which the first InGaAsP layer is stacked is made lower than a temperature at which the AlGaInAs layer is stacked. Since the growth temperature may be lowered after the growth of the AlGaInAs layer, the temperature lowering process is not required after the stacking of the first InGaAsP layer being an etching stopper layer, and the surface protection in the temperature lowering process is saved.

In the method for manufacturing a ridge semiconductor laser according to the present disclosure, there is a characteristic that the temperature is dropped in an AsH$_3$ gas atmosphere after the stacking of the AlGaInAs layer and before the stacking of the first InGaAsP layer. Since an AlGaInAs compound contains one V-group element (only As), the growth temperature may be lowered in an atmosphere of only AsH$_3$ gas for the purpose of protecting a growth surface of the AlGaInAs layer. Namely, the growth surface of the AlGaInAs layer can be protected without considering gas decomposition efficiency.

In the method for manufacturing a ridge semiconductor laser according to the present disclosure, there is a characteristic that the temperature at which the first InGaAsP layer is stacked is lower, by X° C. ($30 \leq X \leq 70$), than the temperature at which the active layer is stacked.

Effect of the Disclosure

The present disclosure can provide a ridge semiconductor laser, which has a structure that can improve the reproducibility of the formation of a diffraction grating during manufacturing and prevent deterioration of a crystal quality of an etching stopper layer, and a method for manufacturing the ridge semiconductor laser.

BRIEF DESCRIPTION OF THE DRAWINGS

FIG. 1A to FIG. 1E are views for explaining a method for manufacturing a ridge semiconductor laser according to the present disclosure;

FIG. 1A shows an epitaxial growth process as a first process;

FIG. 1B shows a diffraction grating formation process as a second process;

FIG. 1C shows an InP clad layer and InGaAs contact layer growth process as a third process;

FIG. 1D shows a ridge waveguide formation process as a fourth process; and

FIG. 1E shows an insulating film and electrode film formation process as a fifth process.

DETAILED DESCRIPTION OF THE PREFERRED EMBODIMENT

Hereinafter, the present disclosure will be described in detail while specifically showing an embodiment, however, the disclosure of the application is not limited to the following description in its interpretation. The components designated by the same reference numerals herein and drawings are the same as each other.

FIG. 1A to FIG. 1E are block diagrams for explaining a manufacturing process of a ridge semiconductor laser 301 of the present embodiment. The manufacturing process includes a first process (FIG. 1A) to a fifth process (FIG. 1E). Furthermore the AlInAs layer, an AlGaInAs layer, a first InGaAsP layer, a first InP layer, and a second InGaAsP layer are respectively described as a carrier stopper layer 16, a clad layer 17, an etching stopper layer 18, a clad layer 19, and a diffraction grating layer 20. Then the clad layer 19 side of a substrate 10 is the upper side herein.

The first process (FIG. 1A) is a stacking process of stacking a semiconductor layer on the substrate 10 made of an n-type InP compound. In the stacking process, the carrier stopper layer 16 made of an AlInAs compound, the clad layer 17 made of an AlGaInAs compound, the etching stopper layer 18 made of an InGaAsP compound, the clad layer 19 made of an InP compound, the diffraction grating layer 20 made of an InGaAsP compound, and a mask layer 21 for diffraction grating formation made of an InP compound are stacked in sequence on one side of an active layer 14 made of an AlGaInAs compound.

In the stacking process, for example, a clad layer 11 made of an InP compound, a carrier stopper layer 12 made of an AlInAs compound, an optical confinement layer 13 made of an AlGaInAs compound, the active layer 14 made of a AlGaInAs compound, an optical confinement layer 15 made of an AlGaInAs compound, the carrier stopper layer 16 made of an AlInAs compound, the clad layer 17 made of an AlGaInAs compound, the etching stopper layer 18 made of an InGaAsP compound, the clad layer 19 made of an InP compound, the diffraction grating layer 20 made of an InGaAsP compound, and the mask layer 21 for diffraction grating formation made of an InP compound are stacked in sequence on the substrate 10 by an MOCVD method.

Further, the layers from the substrate 10 to the optical confinement layer 13 are of n-type, and the layers from the optical confinement layer 15 to the mask layer 21 for diffraction grating formation are of p-type. Then, in the following description, the layers from the clad layer 11 to the etching stopper layer 18 are also referred to as a laser structure layer 30.

In the stacking process, the temperature at which the etching stopper layer 18 is stacked is made lower than the temperature at which the clad layer 17 is stacked. It is preferable that the temperature at which the etching stopper layer 18 is stacked is lower, by 30 to 70° C., than the temperature at which the active layer 14 is stacked. For example, the layers up to the clad layer 17 are grown at 730° C., and the layers above the etching stopper layer 18 are grown at 680° C. At that time, after the stacking of the clad layer 17 and before the stacking of the etching stopper layer 18, the temperature is dropped in an $AsH_3$ gas atmosphere.

Next, the second process (FIG. 1B) will be described. In the second process (FIG. 1B), a diffraction grating is formed in the diffraction grating layer 20. The mask layer 21 for diffraction grating formation on the diffraction grating layer 20 is processed to form a diffraction grating pattern (illustration is omitted), and a diffraction grating pattern is used as a mask, and a diffraction grating 20' is formed by a selective wet etching method in which an InP compound is not etched and only an InGaAsP compound is etched. As a wet etching liquid, an aqueous solution of sulfuric acid and hydrogen peroxide is used. Although InP is used as the mask for diffraction grating formation in the present embodiment, $SiO_2$ and SiN may be used as a mask material.

Next, the third process (FIG. 1C) will be described. In the third process (FIG. 1C), a clad layer 22 made of an InP compound is grown by the MOCVD method to embed the diffraction grating 20'. Further, a contact layer 23 made of an InGaAs compound is grown on the clad layer 22.

Next, the fourth process (FIG. 1D) will be described. In the fourth process (FIG. 1D), a ridge waveguide 40 is formed. First, a mask pattern for ridge formation ($SiO_2$) is formed, and the contact layer 23 is dry-etched, and then the clad layer 22 and the clad layer 19 are wet-etched. In the wet-etching, an etching liquid which is an aqueous solution of hydrochloric acid and phosphoric acid that does not etch the etching stopper layer 18 is used. In this process, a portion free from a mask pattern for ridge is etched down to the etching stopper layer 18 to form the ridge waveguide 40.

Next, the fifth process (FIG. 1E) will be described. In the fifth process (FIG. 1E), an insulating film 24 is formed on the side on which the ridge waveguide 40 is formed, and the insulating film 24 on the upper surface of the ridge waveguide 40 is removed. Further, a p-electrode 25 is formed so as to cover the upper surface of the insulating film 24 and the ridge waveguide 40. Meanwhile, a portion of the lower portion of the substrate 10 is polished, and then an n-electrode 26 is formed.

The ridge semiconductor laser 301 is completed through the above process. Namely, the ridge semiconductor laser 301 is a semiconductor laser in which the carrier stopper layer 16 made of an AlInAs compound and, the clad layer 17 made of an AlGaInAs compound, and the etching stopper layer 18 made of an InGaAsP compound are stacked in sequence on one side of the active layer 14 made of an AlGaInAs compound. The ridge semiconductor laser 301 is provided with the ridge waveguide 40 including, in a layer made of an InP compound, the diffraction grating 20' made of an InGaAsP compound on the opposite side of the clad layer 17 of the etching stopper layer 18.

In a method for manufacturing the ridge semiconductor laser 301, the layers up to the carrier stopper layer 16 are grown at high temperature, and the growth temperature may be lowered without the formation of the clad layer 17 to form the etching stopper layer 18. Since the carrier stopper layer 16 made of an AlInAs compound contains one V-group element, the surface can be easily protected when temperature is lowered.

The carrier stopper layer 16 serves as a barrier that prevents electrons injected into the active layer 14 from overflowing to leak into the clad layers 19 and 22. It is particularly effective in preventing the overflow of electrons at high temperature. Meanwhile, in the carrier stopper layer 16, in order to efficiently inject holes into the active layer 14 from the p-side, it is preferable that the thickness of the carrier stopper layer 16 is reduced as much as possible. As the thickness of the carrier stopper layer 16 becomes smaller, a high-speed performance can be improved. In order to satisfy the above requirements needed for the carrier stopper layer 16, the crystal quality of an AlInAs compound is required to be maintained under the best conditions and so it is more preferable to form the clad layer 17 on the carrier stopper layer 16 and lower the temperature of the carrier stopper layer 16 after the growth of the clad layer 17 than to lower the temperature after the growth of the carrier stopper layer 16.

What is claimed is:

1. A method for manufacturing a ridge semiconductor laser, comprising the steps of:
    stacking in the following sequential order of an AlGaInAs layer, an AlInAs layer, an AlGaInAs clad layer, a first InGaAsP layer, a first InP layer, and a second InGaAsP layer on one side of an AlGaInAs active layer; and
    etching the second InGaAsP layer and forming a diffraction grating, wherein in the stacking step, a temperature at which the first InGaAsP layer is stacked is made lower than a temperature at which the AlGaInAs clad layer is stacked, and wherein the temperature at which the first InGaAsP layer is stacked is lower, by $X° C. (30 \leq X \leq 70)$, than the temperature at which the active layer is stacked.

2. A method for manufacturing a ridge semiconductor laser, comprising the steps of:
    stacking in the following sequential order of an AlGaInAs layer, an AlInAs layer, an AlGaInAs clad layer, a first InGaAsP layer, a first InP layer, and a second InGaAsP layer on one side of an AlGaInAs active layer; and
    etching the second InGaAsP layer and forming a diffraction grating, wherein in the stacking step, a temperature at which the first InGaAsP layer is stacked is made lower than a temperature at which the AlGaInAs clad layer is stacked, wherein the temperature is dropped in an $AsH_3$ gas atmosphere after the stacking of the AlGaInAs clad layer and before the stacking of the first InGaAsP layer, and wherein the temperature at which the first InGaAsP layer is stacked is lower, by $X° C. (30 \leq X \leq 70)$, than the temperature at which the active layer is stacked.

* * * * *